United States Patent
Rahim et al.

(10) Patent No.: US 10,034,400 B2
(45) Date of Patent: Jul. 24, 2018

(54) ITEM STORAGE ARRANGEMENT SYSTEM AND METHOD

(71) Applicant: Mobile Aspects, Inc., Pittsburgh, PA (US)

(72) Inventors: Muhammad R. Rahim, Monroeville, PA (US); Khang Nguyen Le, Murrieta, CA (US); Pribadi Kardono, Monroeville, PA (US); Timur P. Sriharto, Monroeville, PA (US)

(73) Assignee: Mobile Aspects, Inc., Pittsburgh, PA (US)

( * ) Notice: Subject to any disclaimer, the term of this patent is extended or adjusted under 35 U.S.C. 154(b) by 0 days.

(21) Appl. No.: 14/558,064

(22) Filed: Dec. 2, 2014

(65) Prior Publication Data
US 2015/0154434 A1 Jun. 4, 2015

Related U.S. Application Data

(60) Provisional application No. 61/911,680, filed on Dec. 4, 2013.

(51) Int. Cl.
*H05K 5/02* (2006.01)
*G06K 7/10* (2006.01)

(52) U.S. Cl.
CPC ....... *H05K 5/0247* (2013.01); *G06K 7/10356* (2013.01)

(58) Field of Classification Search
CPC . H05K 5/0247; G06K 7/10356; G06Q 10/087
USPC ............... 340/572.1, 10.1, 10.2; 235/375
See application file for complete search history.

(56) References Cited

U.S. PATENT DOCUMENTS

| | | | |
|---|---|---|---|
| 3,958,102 A | 5/1976 | Burt | |
| 4,116,512 A | 9/1978 | Wiser | |
| 4,118,693 A | 10/1978 | Novikoff | |
| 4,227,037 A | 10/1980 | Layton | |
| 4,496,406 A | 1/1985 | Dedow | |
| 4,636,634 A | 1/1987 | Harper et al. | |
| 4,636,950 A | 1/1987 | Caswell et al. | |

(Continued)

FOREIGN PATENT DOCUMENTS

| | | | |
|---|---|---|---|
| JP | 2001052054 A | 2/2001 | |
| JP | 2002282200 A | 10/2002 | |

OTHER PUBLICATIONS

U.S. Appl. No. 14/013,625, filed Aug. 29, 2013.
(Continued)

*Primary Examiner* — Omar Casillashernandez
(74) *Attorney, Agent, or Firm* — The Webb Law Firm

(57) ABSTRACT

A system for storing and tracking at least one item includes a housing having an interior with a plurality of item storage arrangements disposed in or associated with the housing. A plurality of signal receiving arrangements is configured to receive data from a plurality of signal emitting members, and at least one signal receiving arrangement is adjacent to each item storage arrangement. The system also includes a controller in communication with the plurality of signal receiving arrangements, the controller programmed or configured to simultaneously scan at least two signal receiving arrangements from the plurality of signal receiving arrangements. An item storage cabinet and a method of tracking items are also disclosed.

25 Claims, 5 Drawing Sheets

(56) References Cited

U.S. PATENT DOCUMENTS

| | | |
|---|---|---|
| 4,673,932 A | 6/1987 | Ekchian et al. |
| 4,847,764 A | 7/1989 | Halvorson |
| 4,860,918 A | 8/1989 | Wuyten et al. |
| 5,029,183 A | 7/1991 | Tymes |
| 5,194,856 A | 3/1993 | Zijlstra |
| 5,287,414 A | 2/1994 | Foster |
| 5,295,154 A | 3/1994 | Meier et al. |
| 5,389,919 A | 2/1995 | Warren et al. |
| 5,408,443 A | 4/1995 | Weinberger |
| 5,410,315 A | 4/1995 | Huber |
| 5,413,236 A | 5/1995 | Kenevan |
| 5,431,299 A | 7/1995 | Brewer et al. |
| 5,495,961 A | 3/1996 | Maestre |
| 5,565,858 A | 10/1996 | Guthrie |
| 5,689,238 A | 11/1997 | Cannon, Jr. et al. |
| 5,713,485 A | 2/1998 | Liff et al. |
| 5,729,697 A | 3/1998 | Schkolnick et al. |
| 5,739,765 A | 4/1998 | Stanfield et al. |
| 5,751,220 A | 5/1998 | Ghaffari |
| 5,751,221 A | 5/1998 | Stanfield et al. |
| 5,765,707 A | 6/1998 | Kenevan |
| 5,771,003 A | 6/1998 | Seymour |
| 5,774,053 A | 6/1998 | Porter |
| 5,774,059 A | 6/1998 | Henry et al. |
| 5,797,515 A | 8/1998 | Liff et al. |
| 5,801,628 A | 9/1998 | Maloney |
| 5,804,810 A | 9/1998 | Woolley et al. |
| 5,857,152 A | 1/1999 | Everett |
| 5,912,818 A | 6/1999 | McGrady et al. |
| 5,917,433 A | 6/1999 | Keillor et al. |
| 5,936,527 A | 8/1999 | Isaacman et al. |
| 5,950,630 A | 9/1999 | Portwood et al. |
| 5,993,046 A | 11/1999 | McGrady et al. |
| 6,075,441 A | 6/2000 | Maloney |
| 6,112,502 A | 9/2000 | Frederick et al. |
| 6,116,461 A | 9/2000 | Broadfield et al. |
| 6,127,928 A | 10/2000 | Isaacman et al. |
| 6,204,764 B1 * | 3/2001 | Maloney ............ G06K 17/00 235/375 |
| 6,296,148 B1 | 10/2001 | Myers et al. |
| 6,323,782 B1 | 11/2001 | Stephens et al. |
| 6,392,544 B1 | 5/2002 | Collins |
| 6,407,665 B2 | 6/2002 | Maloney |
| 6,424,262 B2 | 7/2002 | Garber et al. |
| 6,445,297 B1 | 9/2002 | Nicholson |
| 6,512,459 B2 | 1/2003 | Benezech et al. |
| 6,512,478 B1 | 1/2003 | Chien |
| 6,658,322 B1 | 12/2003 | Frederick et al. |
| 6,677,857 B2 | 1/2004 | Bara et al. |
| 6,703,935 B1 | 3/2004 | Chung et al. |
| 6,707,381 B1 | 3/2004 | Maloney |
| 6,714,121 B1 | 3/2004 | Moore |
| 6,718,888 B2 | 4/2004 | Muirhead |
| 6,745,027 B2 | 6/2004 | Twitchell, Jr. |
| 6,747,558 B1 | 6/2004 | Thorne et al. |
| 6,750,771 B1 | 6/2004 | Brand |
| 6,762,676 B2 | 7/2004 | Teowee et al. |
| 6,826,514 B1 | 11/2004 | Antico et al. |
| 6,870,464 B2 | 3/2005 | Okamura |
| 6,943,678 B2 | 9/2005 | Muirhead |
| 6,989,749 B2 | 1/2006 | Mohr |
| 7,009,518 B2 | 3/2006 | Liao et al. |
| 7,009,576 B2 | 3/2006 | Adamson et al. |
| 7,126,926 B1 | 10/2006 | Bjorklund et al. |
| 7,130,773 B1 | 10/2006 | Wong |
| 7,135,973 B2 | 11/2006 | Kittel et al. |
| 7,152,791 B2 | 12/2006 | Chappidi et al. |
| 7,187,287 B2 | 3/2007 | Ryal |
| 7,233,620 B2 | 6/2007 | Brommer |
| 7,256,682 B2 | 8/2007 | Sweeney, II |
| 7,265,675 B1 | 9/2007 | Carrender et al. |
| 7,286,043 B2 | 10/2007 | Carrender et al. |
| 7,286,900 B1 | 10/2007 | Frederick et al. |
| 7,298,243 B2 | 11/2007 | Juels et al. |
| 7,310,045 B2 | 12/2007 | Inui |
| 7,318,261 B2 | 1/2008 | Bills |
| 7,342,496 B2 | 3/2008 | Muirhead |
| 7,348,884 B2 | 3/2008 | Higham |
| 7,401,375 B2 | 7/2008 | McLeod |
| 7,420,458 B1 | 9/2008 | Kuzma et al. |
| 7,433,648 B2 | 10/2008 | Bridgelall |
| 7,518,516 B2 | 4/2009 | Azevedo et al. |
| 7,648,065 B2 | 1/2010 | Marino |
| 7,758,523 B2 | 7/2010 | Collings et al. |
| 8,120,497 B2 | 2/2012 | Binmore |
| 8,170,714 B2 | 5/2012 | Spano, Jr. et al. |
| 8,174,392 B1 | 5/2012 | Saghbini et al. |
| 8,484,049 B2 | 7/2013 | Mullenger et al. |
| 8,547,203 B2 * | 10/2013 | Sriharto ............ G08B 13/1427 340/10.1 |
| 8,770,479 B1 * | 7/2014 | Shoenfeld ............ G06Q 90/00 235/375 |
| 2001/0002448 A1 | 5/2001 | Wilson et al. |
| 2001/0028308 A1 | 10/2001 | De La Huerga |
| 2001/0034613 A1 | 10/2001 | Rubsamen |
| 2001/0044731 A1 | 11/2001 | Coffman et al. |
| 2001/0052054 A1 | 12/2001 | Franke et al. |
| 2002/0027507 A1 | 3/2002 | Yarin et al. |
| 2002/0038167 A1 | 3/2002 | Chirnomas |
| 2002/0063622 A1 | 5/2002 | Armstrong et al. |
| 2002/0113082 A1 | 8/2002 | Leatherman et al. |
| 2002/0143320 A1 | 10/2002 | Levin |
| 2002/0145520 A1 | 10/2002 | Maloney |
| 2002/0153411 A1 | 10/2002 | Wan et al. |
| 2002/0183882 A1 | 12/2002 | Dearing et al. |
| 2002/0190871 A1 | 12/2002 | Stanfield et al. |
| 2003/0030539 A1 | 2/2003 | McGarry et al. |
| 2003/0034390 A1 | 2/2003 | Linton et al. |
| 2003/0117281 A1 * | 6/2003 | Sriharto ............ G08B 13/1427 340/568.1 |
| 2003/0160698 A1 | 8/2003 | Andreasson et al. |
| 2003/0164401 A1 | 9/2003 | Andreasson et al. |
| 2003/0174099 A1 | 9/2003 | Bauer et al. |
| 2003/0179078 A1 | 9/2003 | Chen et al. |
| 2004/0046020 A1 | 3/2004 | Andreasson et al. |
| 2004/0069850 A1 | 4/2004 | De Wilde |
| 2004/0069852 A1 | 4/2004 | Seppinen et al. |
| 2004/0111335 A1 | 6/2004 | Black et al. |
| 2004/0155003 A1 | 8/2004 | Anderson et al. |
| 2004/0168618 A1 | 9/2004 | Muirhead |
| 2004/0267545 A1 | 12/2004 | Buchmann et al. |
| 2005/0024211 A1 | 2/2005 | Maloney |
| 2005/0088284 A1 | 4/2005 | Zai et al. |
| 2005/0088305 A1 | 4/2005 | Greene et al. |
| 2005/0093679 A1 | 5/2005 | Zai et al. |
| 2005/0099283 A1 | 5/2005 | Johnson et al. |
| 2005/0237184 A1 | 10/2005 | Muirhead |
| 2005/0241548 A1 | 11/2005 | Muirhead |
| 2005/0280539 A1 | 12/2005 | Pettus |
| 2006/0022800 A1 | 2/2006 | Krishna et al. |
| 2006/0028081 A1 | 2/2006 | Minagawa |
| 2006/0056370 A1 | 3/2006 | Hancock et al. |
| 2006/0058018 A1 | 3/2006 | Toulis et al. |
| 2006/0092040 A1 | 5/2006 | Fishkin et al. |
| 2006/0109084 A1 | 5/2006 | Yarvis |
| 2006/0143439 A1 | 6/2006 | Arumugam et al. |
| 2006/0187043 A1 | 8/2006 | Allen |
| 2006/0215593 A1 | 9/2006 | Wang et al. |
| 2007/0046467 A1 | 3/2007 | Chakraborty et al. |
| 2007/0096876 A1 | 5/2007 | Bridgelall et al. |
| 2007/0103303 A1 | 5/2007 | Shoarinejad |
| 2007/0164109 A1 | 7/2007 | Ridings et al. |
| 2007/0171992 A1 | 7/2007 | Shameli et al. |
| 2007/0172007 A1 | 7/2007 | Shoarinejad et al. |
| 2007/0188342 A1 | 8/2007 | Valeriano et al. |
| 2007/0200724 A1 | 8/2007 | Lazo et al. |
| 2007/0216534 A1 | 9/2007 | Ferguson et al. |
| 2007/0279202 A1 | 12/2007 | Lionetti |
| 2008/0061940 A1 | 3/2008 | Onderko et al. |
| 2008/0117050 A1 | 5/2008 | Wu et al. |
| 2008/0198016 A1 | 8/2008 | Lawrence et al. |
| 2008/0218354 A1 | 9/2008 | Lorentz et al. |
| 2008/0284654 A1 * | 11/2008 | Burnside ............ G06K 7/0008 343/700 MS |

(56) References Cited

U.S. PATENT DOCUMENTS

| | | | |
|---|---|---|---|
| 2008/0316045 A1* | 12/2008 | Sriharto | G06Q 50/22 340/10.1 |
| 2009/0009332 A1 | 1/2009 | Nunez et al. | |
| 2009/0261956 A1 | 10/2009 | Ojeda et al. | |
| 2011/0139871 A1* | 6/2011 | Yturralde | G06K 7/10336 235/385 |
| 2012/0229258 A1* | 9/2012 | Lim | G06K 7/10128 340/10.1 |
| 2014/0138440 A1 | 5/2014 | D'Ambrosio et al. | |

OTHER PUBLICATIONS

U.S. Appl. No. 14/487,809, filed Sep. 16, 2014.
U.S. Appl. No. 14/455,131, filed Aug. 8, 2014.
U.S. Appl. No. 14/524,542, filed Oct. 27, 2014.
U.S. Appl. No. 13/793,201, filed Mar. 11, 2013.
U.S. Appl. No. 13/662,897, filed Oct. 29, 2012.

* cited by examiner

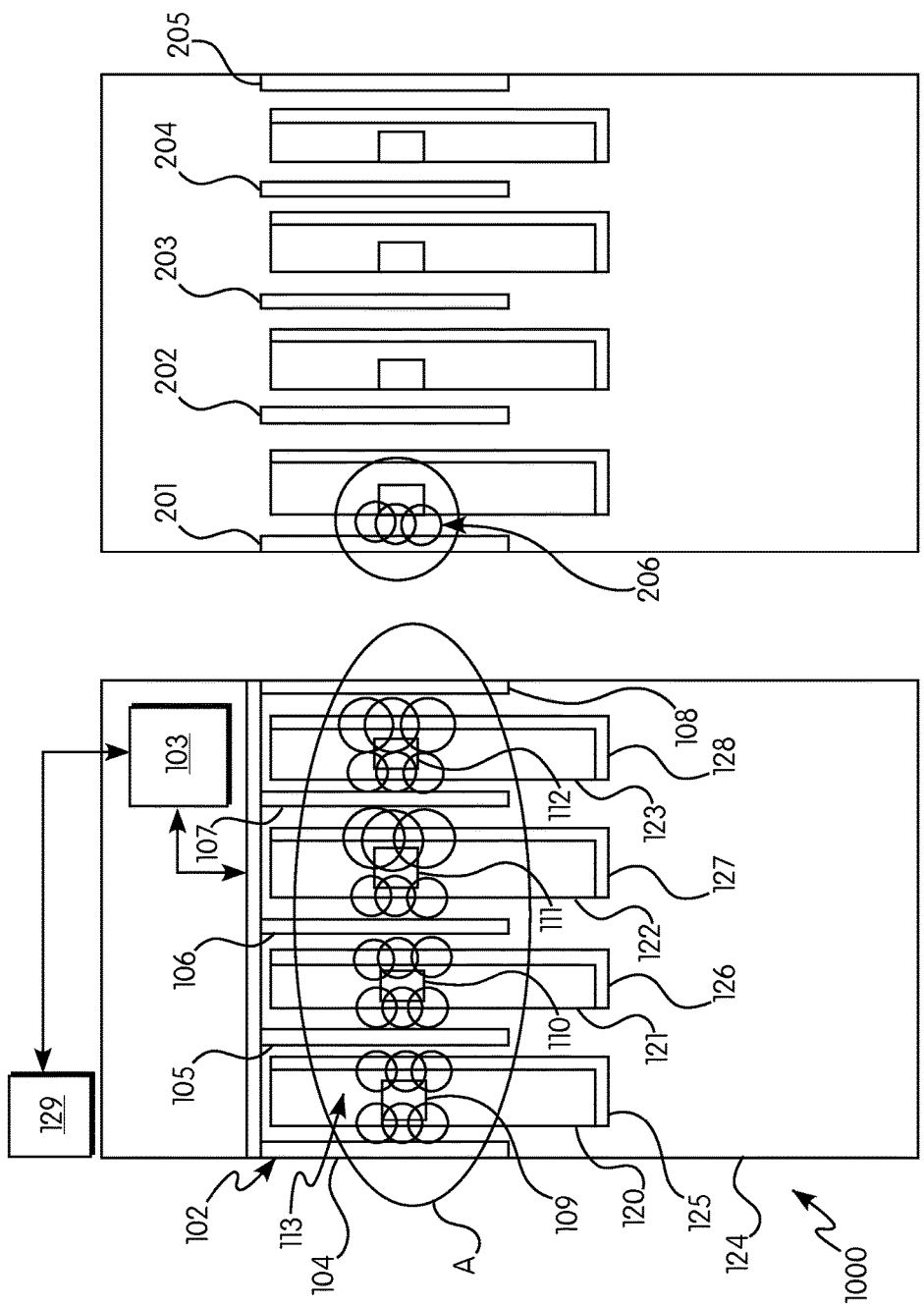

ITEM STORAGE ARRANGEMENT SYSTEM AND METHOD

CROSS REFERENCE TO RELATED APPLICATIONS

This application claims benefit of priority from U.S. Provisional Patent Application No. 61/911,680, filed Dec. 4, 2013, which is incorporated herein by reference in its entirety.

BACKGROUND OF THE INVENTION

Field of the Invention

The present invention relates generally to storage and tracking cabinets and arrangements. In particular, the present invention relates to an item storage arrangement system and a system and method for decreasing scan time while increasing accuracy.

Description of Related Art

Presently, in the health care industry, complex and expensive equipment and systems are utilized in the diagnosis and care processes. As the development of this equipment and associated systems continues, the necessity to monitor and track the usage of equipment is of the utmost importance. Certain drawbacks and deficiencies exist in the prior art, including: (1) theft of the equipment or its components; (2) inaccurate manual compliance and tracking methods; (3) ineffective and inefficient compliance monitoring and similar management; (4) inefficient equipment sharing and distribution; (5) difficulty in tracking; (6) inaccurate identification and tracking methods; (7) problems identifying specific items from a plurality of items, etc.

In hospitals, items, such as catheters, are stored in large cabinets with RFID tagged catheters hung from hangers with antenna modules interspersed between each of the catheters. Each time the cabinet door is closed, the cabinet locks and the catheter RFID tags are scanned. During this time, the cabinet remains locked until the scan is complete. Once the scan is complete, hospital staff members are able to open the unlocked doors and take the needed catheters. In this way, the hospital tracks the usage and inventory of catheters by scanning the inventory every time the cabinet is opened and closed.

This system presents several advantages, the first and foremost being the more efficient monitoring of items and equipment. This allows hospitals to monitor the entire inventory and to re-order the item in bulk when the inventory falls below a certain threshold, rather than each staff member or department monitoring use and re-ordering items based on the individual use. The use of RFID tags also allows for more accurate accounting of inventory because the scan occurs automatically whenever the cabinet door is opened and closed, and it eliminates the error of staff members forgetting to report item use or accidentally reporting the incorrect amount of items used. By more accurately ordering in bulk, hospitals are able to save money using a volume discount, ordering less often, and centralizing the ordering process to an individual, rather than having the catheter users order new items or report their use to their department.

However, for all of the advantages RFID cabinets provide to hospitals, significant disadvantages persist. In conventional RFID cabinets, the slots which house the medical devices are placed in rows and antenna modules are placed between each of the slots. Whenever the cabinet door is closed, the antennas scan the medical devices and determine how many items are present based on the number of positive signals received from the medical device RFID tags. Problems arise because each antenna must scan its respective row before the next antenna begins the scanning sequence. If each antenna requires approximately four seconds for a scan, and with, hypothetically, five antennas, it will take a total of 20 seconds to scan the entire cabinet because each four-second scan must be complete before the next four-second scan can commence.

This can be particularly problematic in high traffic areas because, while the scan is ongoing, the cabinet door remains locked. If one staff member retrieves an item and closes the cabinet door, the next staff member will need to wait the full 20 seconds before he/she is able to access the cabinet. In high traffic areas, the compounded time lost in waiting for the doors to unlock can be significant. The lost time is detrimental to more important hospital operations. Additionally, by finding a more accurate and faster way to scan a high volume of items, cabinets can be made larger for a more efficient use of space. Using conventional technology, larger cabinets necessitate more time to scan the cabinets, resulting in even more time lost.

SUMMARY OF THE INVENTION

Generally, provided is an improved item storage and tracking cabinet, system, and method for use in a variety of environments and applications where items require tracking and management. Preferably, provided is an item storage and tracking cabinet, system, and method for use in the healthcare industry, such as a hospital or the like, wherein various medical items need to be tracked. Preferably, provided is an item storage and tracking cabinet, system, and method that tracks multiple items and associates them with one or more users. Preferably, provided is an item storage and tracking cabinet, system, and method that is useful in connection with a radio frequency identification application, such as with items tagged or associated with specified items.

According to another preferred and non-limiting embodiment or aspect, provided is an item storage system, including: at least one housing having an interior; a plurality of item storage arrangements disposed in or associated with the at least one housing; a plurality of signal receiving arrangements configured to receive signals or data from a plurality of signal emitting members, wherein at least one signal receiving arrangement is substantially adjacent each item storage arrangement; and at least one controller in communication with the plurality of signal receiving arrangements, the at least one controller programmed or configured to simultaneously activate at least two signal receiving arrangements from the plurality of signal receiving arrangements.

In one preferred and non-limiting embodiment or aspect, each item storage arrangement is positioned substantially adjacent at least two signal receiving arrangements of the plurality of signal receiving arrangements. In another preferred and non-limiting embodiment or aspect, the plurality of signal receiving arrangements are spaced in the interior of the at least one housing, and wherein each item storage arrangement is located between at least two signal receiving arrangements. In one preferred and non-limiting embodiment or aspect, at least one of the item storage arrangements comprises at least one of the following: a hanger, a compartment, a slot, a container, a shelf, a hook, or any combination thereof.

In one preferred and non-limiting embodiment or aspect, the at least one housing comprises a cabinet with at least one door. In another preferred and non-limiting embodiment or aspect, the at least one controller is further programmed or configured to activate the plurality of signal receiving arrangements, such that the signals or data of the plurality of signal emitting devices are received after the at least one door is closed from an open position. In a further preferred and non-limiting embodiment or aspect, the system comprises at least one locking mechanism configured to lock and unlock the at least one door of the cabinet, wherein the at least one locking mechanism locks the at least one door of the cabinet while the plurality of signal emitting members are interrogated or scanned. In one preferred and non-limiting embodiment or aspect, the item storage system is configured to store at least one of the following: medical items, catheters, containers, medicine, instruments, equipment, components, or any combination thereof.

In one preferred and non-limiting embodiment or aspect, provided is an item storage cabinet for tracking items having signal emitting members attached thereto or associated therewith, the cabinet comprising: an interior cavity or area; a plurality of item storage arrangements positioned in or associated with the interior cavity, each item storage arrangement configured to support at least one item having at least one signal emitting member attached thereto or associated therewith; a plurality of signal receiving arrangements, wherein at least one signal receiving arrangement of the plurality of signal receiving arrangements is located between each item storage arrangement; and at least one controller programmed or configured to activate the plurality of signal receiving arrangements, such that at least two signal receiving arrangements of the plurality of signal receiving arrangements interrogate or scan each signal emitting member of the plurality of signal emitting members.

In one preferred and non-limiting embodiment or aspect, the plurality of signal receiving arrangements are spaced in the interior cavity, and wherein each item storage arrangement is located between two signal receiving arrangements. In another preferred and non-limiting embodiment or aspect, the plurality of signal receiving arrangements are spaced substantially evenly in the interior cavity.

In one preferred and non-limiting embodiment or aspect, at least one of the item storage arrangements comprises at least one of the following: a hanger, a compartment, a slot, a container, a shelf, a hook, or any combination thereof. In one preferred and non-limiting embodiment or aspect, the cabinet comprises at least one drawer or at least one door for providing access to at least a portion of the interior cavity of the cabinet. In another preferred and non-limiting embodiment or aspect, the at least one controller is further programmed or configured to activate the plurality of signal receiving arrangements after the at least one drawer or the at least one door is closed from an open position. In a further preferred and non-limiting embodiment or aspect, the cabinet further comprises at least one locking mechanism configured to lock and unlock the at least one drawer or the at least one door, wherein the at least one locking mechanism locks the cabinet while the plurality of signal emitting members are interrogated or scanned.

In one preferred and non-limiting embodiment or aspect, provided is a method for tracking items in an item storage arrangement system, comprising: using at least one signal receiving arrangement, simultaneously interrogating or scanning each signal emitting member attached to or associated with at least one item supported by at least one item storage arrangement of a plurality of item storage arrangements; receiving identification signals or data from at least one item emitting member attached to or associated with at least one item supported by an item storage arrangement of the plurality of item storage arrangements; determining, based at least partially on the identification data or signals, a presence or absence of the at least one item; and controlling at least one indication device based at least partially on the presence or absence of the at least one item.

In one preferred and non-limiting embodiment or aspect, at least one of the plurality of item storage arrangements is oriented in a substantially vertical arrangement. In another preferred and non-limiting embodiment or aspect, at least one of the plurality of item storage arrangements is oriented in a substantially horizontal arrangement. In another preferred and non-limiting embodiment or aspect, the plurality of item storage arrangements is at least partially contained in or associated with an interior of at least one housing. In a further preferred and non-limiting embodiment or aspect, at least one of the item storage arrangements comprises at least one of the following: a hanger, a compartment, a slot, a container, a shelf, a hook, or any combination thereof.

Further preferred and non-limiting embodiment or aspects of the present inventions are set forth in the following numbered clauses.

Clause 1: An item storage system, comprising: at least one housing having an interior; a plurality of item storage arrangements disposed in or associated with the at least one housing; a plurality of signal receiving arrangements configured to receive signals or data from a plurality of signal emitting members, wherein at least one signal receiving arrangement is substantially adjacent each item storage arrangement; and at least one controller in communication with the plurality of signal receiving arrangements, the at least one controller programmed or configured to simultaneously activate at least two signal receiving arrangements from the plurality of signal receiving arrangements.

Clause 2: The item storage system of clause 1, wherein each item storage arrangement is positioned substantially adjacent at least two signal receiving arrangements of the plurality of signal receiving arrangements.

Clause 3: The item storage system of clause 1 or clause 2, wherein the plurality of signal receiving arrangements are spaced in the interior of the at least one housing, and wherein each item storage arrangement is located between at least two signal receiving arrangements.

Clause 4: The item storage system of any of clauses 1-3, wherein at least one of the item storage arrangements comprises at least one of the following: a hanger, a compartment, a slot, a container, a shelf, a hook, or any combination thereof.

Clause 5: The item storage system of any of clauses 1-4, wherein the at least one housing comprises a cabinet with at least one door.

Clause 6: The item storage system of clause 5, wherein the at least one controller is further programmed or configured to activate the plurality of signal receiving arrangements, such that the signals or data of the plurality of signal emitting devices are received after the at least one door is closed from an open position.

Clause 7: The item storage system of clause 6, further comprising at least one locking mechanism configured to lock and unlock the at least one door of the cabinet, wherein the at least one locking mechanism locks the at least one door of the cabinet while the plurality of signal emitting members are interrogated or scanned.

Clause 8: The item storage system of any of clauses 1-7, wherein the item storage system is configured to store at least one of the following: medical items, catheters, containers, medicine, instruments, equipment, components, or any combination thereof.

Clause 9: An item storage cabinet for tracking items having signal emitting members attached thereto or associated therewith, the cabinet comprising: an interior cavity or area; a plurality of item storage arrangements positioned in or associated with the interior cavity, each item storage arrangement configured to support at least one item having at least one signal emitting member attached thereto or associated therewith; a plurality of signal receiving arrangements, wherein at least one signal receiving arrangement of the plurality of signal receiving arrangements is located between each item storage arrangement; and at least one controller programmed or configured to activate the plurality of signal receiving arrangements, such that at least two signal receiving arrangements of the plurality of signal receiving arrangements interrogate or scan each signal emitting member of the plurality of signal emitting members.

Clause 10: The item storage cabinet of clause 9, wherein the plurality of signal receiving arrangements are spaced in the interior cavity, and wherein each item storage arrangement is located between two signal receiving arrangements.

Clause 11: The item storage cabinet of clause 10, wherein the plurality of signal receiving arrangements are spaced substantially evenly in the interior cavity.

Clause 12: The item storage system of any of clauses 9-11, wherein at least one of the item storage arrangements comprises at least one of the following: a hanger, a compartment, a slot, a container, a shelf, a hook, or any combination thereof.

Clause 13: The item storage system of any of clauses 9-12, further comprising at least one drawer or at least one door for providing access to at least a portion of the interior cavity of the cabinet.

Clause 14: The item storage system of clause 13, wherein the at least one controller is further programmed or configured to activate the plurality of signal receiving arrangements after the at least one drawer or the at least one door is closed from an open position.

Clause 15: The item storage system of clause 13 or clause 14, further comprising at least one locking mechanism configured to lock and unlock the at least one drawer or the at least one door, wherein the at least one locking mechanism locks the cabinet while the plurality of signal emitting members are interrogated or scanned.

Clause 16: A method for tracking items in an item storage arrangement system, comprising: using at least one signal receiving arrangement, simultaneously interrogating or scanning each signal emitting member attached to or associated with at least one item supported by at least one item storage arrangement of a plurality of item storage arrangements; receiving identification signals or data from at least one item emitting member attached to or associated with at least one item supported by an item storage arrangement of the plurality of item storage arrangements; determining, based at least partially on the identification data or signals, a presence or absence of the at least one item; and controlling at least one indication device based at least partially on the presence or absence of the at least one item.

Clause 17: The method for tracking items in a storage arrangement system of clause 16, wherein at least one of the plurality of item storage arrangements is oriented in a substantially vertical arrangement.

Clause 18: The method for tracking items in a storage arrangement system of clause 16 or clause 17, wherein at least one of the plurality of item storage arrangements is oriented in a substantially horizontal arrangement.

Clause 19: The method for tracking items in a storage arrangement system of any of clauses 16-18, wherein the plurality of item storage arrangements is at least partially contained in or associated with an interior of at least one housing.

Clause 20: The method for tracking items in an item storage arrangement system of any of clauses 16-19, wherein at least one of the item storage arrangements comprises at least one of the following: a hanger, a compartment, a slot, a container, a shelf, a hook, or any combination thereof.

These and other features and characteristics of the present invention, as well as the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and the claims, the singular form of "a", "an", and "the" include plural referents unless the context clearly dictates otherwise.

BRIEF DESCRIPTION OF THE DRAWINGS

FIG. 1 is a front schematic view of an item storage arrangement system according to the principles of the present invention;

FIG. 2 is a front schematic view of one embodiment or aspect of an item storage arrangement system according to the prior art;

DETAILED DESCRIPTION OF THE PREFERRED EMBODIMENTS OR ASPECTS

Figure 3:
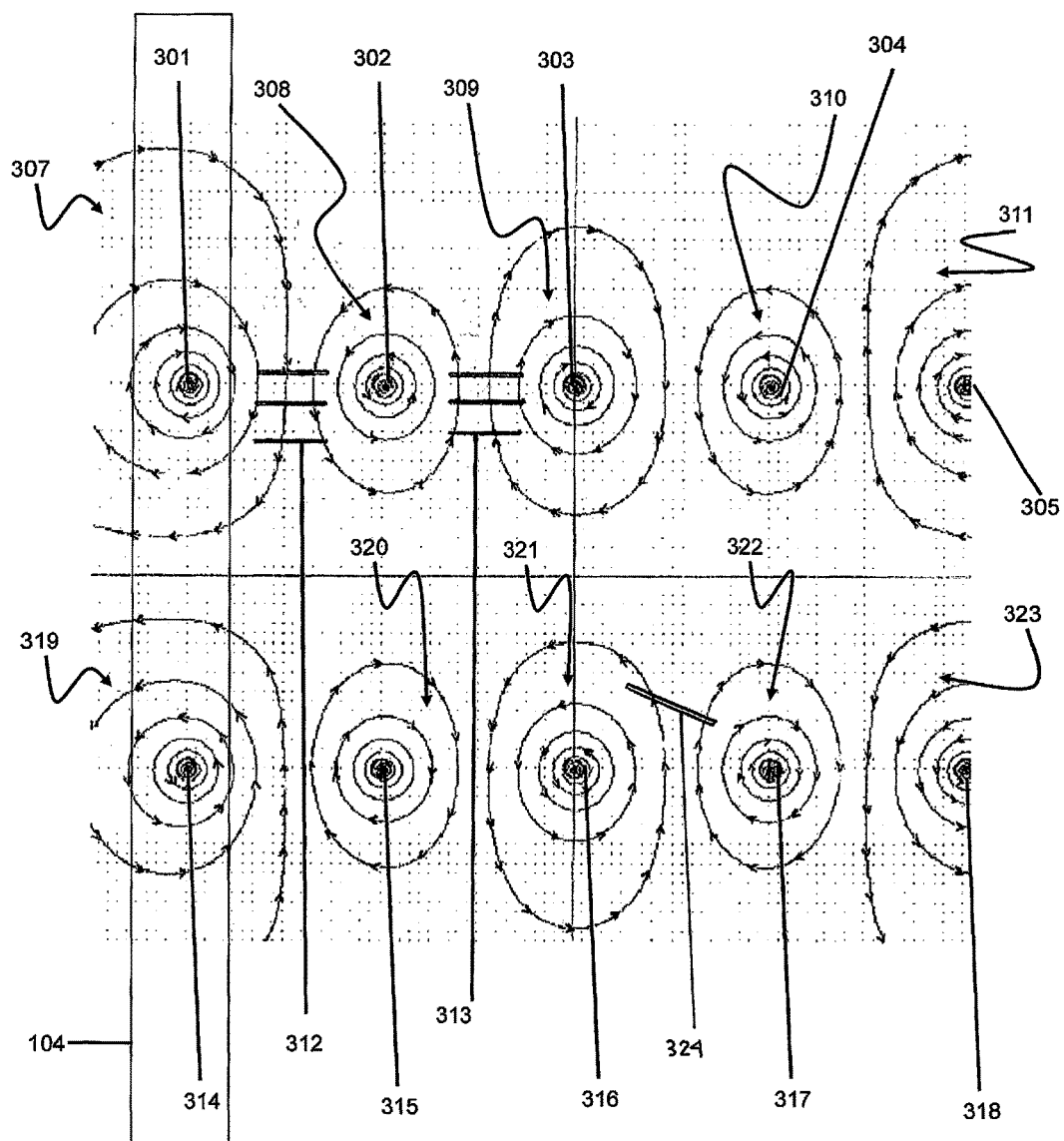
FIG. 3 is a front schematic view of the support structures shown in the area A of the item storage arrangement system of FIG. 1 according to the principles of the present invention.

For purposes of the description hereinafter, the terms "upper", "lower", "right", "left", "vertical", "horizontal", "top", "bottom", "lateral", "longitudinal" and derivatives thereof shall relate to the invention as it is oriented in the drawing figures. However, it is to be understood that the invention may assume various alternative variations and step sequences, except where expressly specified to the contrary. It is also to be understood that the specific devices and processes illustrated in the attached drawings, and described in the following specification, are simply exemplary embodiments or aspects of the invention. Hence, specific dimensions and other physical characteristics related to the embodiments or aspects disclosed herein are not to be considered as limiting.

As used herein, the terms "communication" and "communicate" refer to the receipt, transmission, or transfer of one or more signals, messages, commands, or other type of data. For one unit or device to be in communication with another unit or device means that the one unit or device is able to receive data from and/or transmit data to the other unit or device. A communication may use a direct or indirect connection, and may be wired and/or wireless in nature. Additionally, two units or devices may be in communication with each other even though the data transmitted may be modified, processed, routed, etc., between the first and second unit or device. For example, a first unit may be in communication with a second unit even though the first unit passively receives data, and does not actively transmit data to the second unit. As another example, a first unit may be in communication with a second unit if an intermediary unit processes data from one unit and transmits processed data to the second unit. It will be appreciated that numerous other arrangements are possible. Any known electronic communication protocols and/or algorithms may be used such as, for example, TCP/IP (including HTTP and other protocols), WLAN (including 802.11 and other radio frequency-based protocols and methods), analog transmissions, and/or the like.

According to a preferred and non-limiting embodiment or aspect of the present invention, an item storage arrangement system is used to support, house, store, hang, arrange, and/or support items, such as medical items (e.g., catheters, containers, medicine, instruments, equipment, components, etc.), associated with identifying data. The identifying data may be stored on the items or on separate, but attachable, signal emitting members, e.g., tags, transponders, radio frequency identification (RFID) tags, programmable devices, or other like identification devices configured to store the identifying data. The items may include any item suitable for placing on flat surfaces or hanging on a support structure such as, but not limited to, catheters.

Referring now to FIG. 1, an item storage arrangement system 1000 is shown according to a preferred and non-limiting embodiment or aspect of the present invention. The item storage arrangement system 1000 is associated with or configured to hold or contain one or more items 120-123, at least one of which is fitted with or otherwise associated with a respective signal emitting member 109-112, and placed on, placed in, engaged with, or associated with one or more item storage arrangements 125-128. The item storage arrangements 125-128 can be arranged horizontally, such as on a table, on a shelf, in a compartment, in a slot, in a drawer, and/or the like, or arranged or supported vertically by using support structures to hold the items 120-123 in place, such as a hanger, a hook, and/or the like. These item storage arrangements 125-128 are sized, shaped, or function to support at least one item 120-123, such that the signals emitted by the signal emitting member, e.g., a transponder or tag (as discussed hereinafter), attached to or associated with the at least one item 120-123 can be effectively received by the signal receiving arrangements, members, or devices, e.g., at least one antenna (as discussed hereinafter).

FIG. 1 is a front view of the item storage arrangement system 1000 in a preferred and non-limiting vertical embodiment or aspect. However, it can be appreciated that the view of FIG. 1 could also be a top view, wherein the item storage arrangement system is in a horizontal configuration. The horizontal surface can be anything capable of supporting the items 120-123 including, but not limited to a drawer, a flat slab, a recessed plane, and/or the like. In the vertical configuration, the support structures can be anything capable of holding the items 120-123 in place (i.e., retaining the items 120-123 in hanging position), including, but not limited to, hooks, bars, snaps, ties, clasps, and the like.

In this embodiment or aspect, the item storage arrangement system 1000 further includes a signal receiving module 102. The signal receiving module 102 further includes a signal receiving controller 103 and one or more signal receiving arrangements 104-108, which may be one or more antennae, RFID readers, and/or other like devices that are capable of receiving signals or data and, in some non-limiting examples, activating a passive transponder. The item storage arrangements 125-128 may take a variety of forms and configurations. In a preferred and non-limiting embodiment or aspect, the signal receiving arrangements 104-108 can form partitions between the items to create a slot. The item storage arrangements 125-128 could also be formed from a mold or prefabricated design where the signal receiving arrangements 104-108 are located in the mold or prefabricated design. In addition, the signal receiving arrangements 104-108 may be spaced, e.g., substantially evenly spaced, with respect to each other, or configured or spaced in a specified manner to maximize the reading, scanning, and/or interrogation function. For example, the signal receiving arrangement 104-108 may be attached to, formed with, or integrated with some support structure that can be positioned in the system, and the support structure may be configured for removable attachment or adjustment within the system 1000.

With continued reference to FIG. 1, the signal receiving controller 103 is adapted, programmed, and/or configured to communication with, activate, and/or otherwise control the plurality of signal receiving arrangements 104-108 based at least in part on at least a portion of the data received from the signal receiving arrangements 104-108 and/or based upon other actions to be implemented in the system 1000. The signal receiving controller 103 is capable of controlling the plurality of signal receiving arrangements 104-108, such that the plurality of signal receiving arrangements 104-108 simultaneously, or substantially simultaneously, activate and/or receives data from the signal emitting members 109-112, as well as being capable of producing a higher magnetic field 113 than a signal receiving arrangement 104-108 without control by the signal receiving controller 103.

The system 1000 may be configured with a primary controller 129. The primary controller 129 may comprise one or more computers, microprocessors, circuits, software modules, and/or other like data processing systems or devices. In a preferred and non-limiting embodiment or aspect, the primary controller 129 may be a specially-programmed computer configured with compiled program instructions to operate, control, and/or monitor one or more aspects of the item storage arrangement system 1000. In other examples, the primary controller 129 may be a mobile device, remote server, microprocessor with embedded program instructions, and/or a networked computer. In some non-limiting embodiments or aspects, the signal receiving controller 103 may include a serial bus, such that the data from multiple signal receiving arrangements 104-108 may be simultaneously read by the primary controller. For example, the signal receiving controller 103 may include a USB or other like serial output. It will be appreciated that the primary controller 129 may also receive signals in parallel and/or substantially simultaneously.

For inventorying purposes, the data received by the signal receiving arrangements 104-108 may represent a "present" signal or no signal (which would indicate an "absence" of the item 120-123 in the system 1000). Of course, the signal emitting members 109-112 may be programmed with any type or format of readable data, such as item identification, item category, item function, item conditions, item status, authorization data, user data, environmental data or information, and/or the like. In one preferred and non-limiting embodiment or aspect, when an item 120-123, such as a medical item, is placed on or associated with the item storage arrangement 125-128, it will cause the signal receiving arrangements 104-108 to provide or generate a "present" signal, which indicates that the space for the item is occupied. If item 120-123 is not present, there will be no such signal. In one preferred and non-limiting embodiment or aspect, where each item storage arrangement 125-128 is configured for supporting or associated with a specified item 120-123, and when all of the signal receiving arrangements 104-108 receive a signal, it indicates that the item storage arrangement system 1000 is fully stocked. When no signals are present, it indicates that the item storage arrangement system 1000 is empty. In the intermediary stage, where some items 120-123 are present and some are not, the item storage arrangement system 1000 will use an output to either provide an accounting of which items are present and/or missing, or provide a total number of present items versus a total number of missing items. This information can then be used to determine when to re-order items, and how many should be ordered.

While the signal can be a "present" or no signal, and as discussed above, other types of data may be used in connection with the present invention. In another preferred and non-limiting embodiment or aspect, for example, the data could correspond to a specific type, category, or group of item 120-123. This would be accomplished by differentiating or specially programming the signal emitting members 109-112 to provide different signals or data. For example, one of the signal emitting members 109-112 could correspond to catheters, and a second signal emitting member 109-112 could correspond to another piece of medical equipment, and the signals could alert the user to the remaining number of catheters and the remaining number of other units of medical equipment. It will be appreciated that various other arrangements are possible.

In a preferred but non-limiting embodiment or aspect, the item storage arrangement system 1000 includes at least one housing 124, which may be arranged or positioned in a generally vertical arrangement or position (e.g., a cabinet), a generally horizontal arrangement or position (e.g., a drawer-based unit), or any combination thereof. In one preferred and non-limiting embodiment, the housing 124 forms an internal cavity for the signal storage arrangements 125-128, and in one preferred and non-limiting embodiment or aspect, the housing 124 may form or be part of a cabinet. An exemplary storage cabinet is described in U.S. Pat. No. 8,414,471, which is hereby incorporated by reference in its entirety. In other examples, the item storage arrangements 125-128 may include a rack that is installable on a wall or ceiling, or may be part of a free-standing floor rack. Moreover, the item storage arrangements 125-128 may include support structures that are independently connected to a wall or ceiling, without needing a common structure or panel.

If the item storage arrangements 125-128 are placed in a cabinet, it may be ideal to place a locking mechanism on the cabinet wall, such that the signal receiving arrangements 104-108 are activated when the cabinet door is closed. A limit switch could provide the "door closed" signal necessary to commence a scan using the signal receiving arrangements 104-108. Once the door is closed, it can remain locked while the signal receiving arrangements 104-108 complete their scan. Once the scan is complete, the door will unlock and another user will be able to retrieve or insert an item 120-123. This ensures a high level of accuracy because the data cannot be interrupted or corrupted by individuals opening and closing the door while the scan is taking place. As such, the locking mechanism can be controlled by the controller 103, or some separate computer, controller, control device, and/or the like.

In another preferred and non-limiting embodiment or aspect, the housing 124, which forms an internal cavity for the signal storage arrangements 125-128, can be in the form of or integrated with the sidewall of a drawer or compartment. Like the above-discussed cabinet-type configuration, the same locking and scanning mechanism can be used in a drawer-type configuration. An exemplary drawer storage system, and storage system generally, is described in U.S. Pat. No. 8,547,203, which is hereby incorporated by reference in its entirety. When the user closes the drawer, the drawer may lock while the items are scanned, and the drawer can unlock when the scan is complete. Again, the controller 103 can control the locking mechanism, or some separate computer, controller, control device, and/or the like can be used.

In a preferred and non-limiting embodiment or aspect, the drawer may also be placed in a cabinet with a locking mechanism and/or signal mechanism for door position. In this configuration, the drawer can be placed such that when the drawer is open, it impedes the cabinet door from closing. In this way, the user must close the drawer to close the cabinet door. When the cabinet door is closed, it locks while the scan inside the drawer is ongoing. When the scan is complete, the cabinet door can unlock.

In another embodiment or aspect, the items are simply laid on a table with the signal receiving arrangements 104-108 in the cabinet. In some non-limiting embodiments or aspects, the item storage arrangement system 1000 is adapted, programmed, and/or configured to authenticate a user based on the user's credentials and a database of authorized personnel. The user's credentials may include data stored on a personalized signal emitting member, a password or digital signature, a fingerprint scan or other biometric, and/or the like. Moreover, a user's credentials may also be used to associate a particular user with an item 120-123 when it is removed and/or returned to the item storage arrangement 125-128, tracking users' interactions with an item 120-123 over time. It will be appreciated that various other arrangements and configurations are possible.

In yet a further preferred and non-limiting embodiment or aspect, if the item storage arrangements 125-128 are placed in a vertical arrangement, the support structures may comprise or be attached to a transducer, sensor, accelerometer, and/or other like device capable of measuring and/or detecting a force, or lack thereof, applied to a support structure. As an example, the item storage arrangement system 1000 may interrogate or scan items (i.e., the signal emitting members 109-112 attached to or associated with each item 120-123) supported by the support structures in response to an item 120-123 being removed from or added to a support structure. By detecting when an item is removed from or added to a particular support structure, the item storage arrangement system 1000 can then associate that item 120-123 with that support structure, and track that item as having been removed or added. It will be appreciated that numerous other arrangements may be used to distinguish between signals received from items 120-123 on different support structures. For example, the signal receiving arrangement(s) 104-108 may be positioned such that the support structures can be distinguished based on proximity (e.g., signal strength).

Referring now to FIG. 2, the prior art item storage arrangement system 2000 only allows for a single signal receiving arrangement 201-205 to activate one at a time, normally sequentially. This creates a single magnetic field 206. In this known arrangement, once the first signal receiving arrangement 201 completes its sequence, the second signal receiving arrangement 202 activates and so on, such that the time required to scan the entire system is the compounded time of all the signal receiving arrangements 201-205 scanning sequences.

Referring now to FIG. 3, a schematic view of area (A) shown in FIG. 1 is illustrated. The item storage arrangement system 1000 is shown according to a preferred and non-limiting embodiment or aspect. In this embodiment, the signal receiving arrangements 104-108 include or are in the form of a plurality of antennae 301-305, or, as an alternative embodiment or aspect, a conductive material. For continuity between FIG. 1 and FIG. 3, signal receiving arrangement 104 is illustrated, though the other antennae 302-305 correspond to signal receiving arrangements 105-108.

In a preferred and non-limiting embodiment or aspect, and with continued reference to FIG. 3, the antennae 301-305 emit a field 307-311 for the detection of the signals or data emitted by signal emitting members 312-313. The antennae 301-305, 314-318 are configured to produce a signal in a bilateral direction. This allows for increased accuracy since each signal emitting member 312-313 can be scanned by the antenna on either side. For example, signal emitting member 312 is scanned by antenna 301 and antenna 302, and signal emitting member 313 is scanned by antenna 302 and antenna 303. In FIG. 1, each signal receiving arrangement 104-108 scans the signal emitting members 109-112 to the right and to the left of each signal receiving arrangement 104-108.

While each of the signal receiving arrangements 104-108 could comprise a single antenna, in a preferred and non-limiting embodiment or aspect, each signal receiving arrangement has at least a second antenna 314-318 with emitting fields 319-323. For example, signal receiving arrangement 104, as shown in FIG. 3, would have a first antenna 301 and a second antenna 314 to more accurately detect an item. This is also advantageous because, if the item is misplaced and the signal emitting member 312 is out of range of the first antennae 301-305, the second antennae 314-318 may detect the item, i.e., the signal emitting member associated with the item, such as signal emitting member 324 located between antenna 316 and antenna 317.

Figure 4:
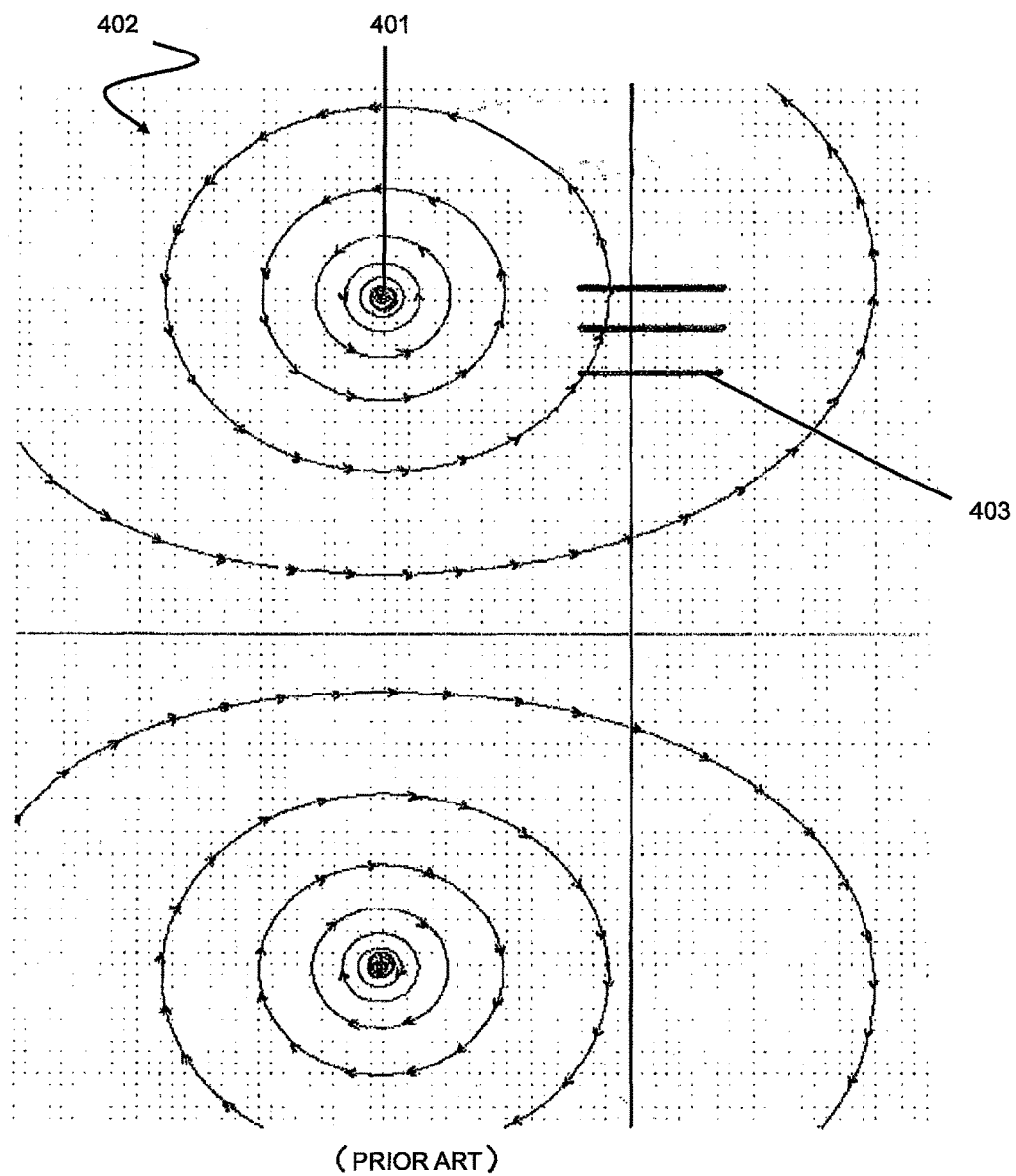
FIG. 4 is a front schematic view of two support structures shown in the area B of the item storage arrangement system of FIG. 2 according to the prior art.

Referring now to FIG. 4, a schematic view of area (B) shown in FIG. 2 is illustrated. In the prior art, only one antenna 401 is active at a time, which produces a field 402 to receive a signal from the signal emitting member 403. Each antenna 401 must complete its scan before the next is able to begin, and in this way, only a single signal emitting member 403 can be scanned at a time. When compared to FIG. 3, which shows a substantially simultaneous scan from the different signal receiving arrangements, it can be appreciated that the configuration in FIG. 3 takes significantly less time to complete the scanning or interrogation process.

Figure 5:
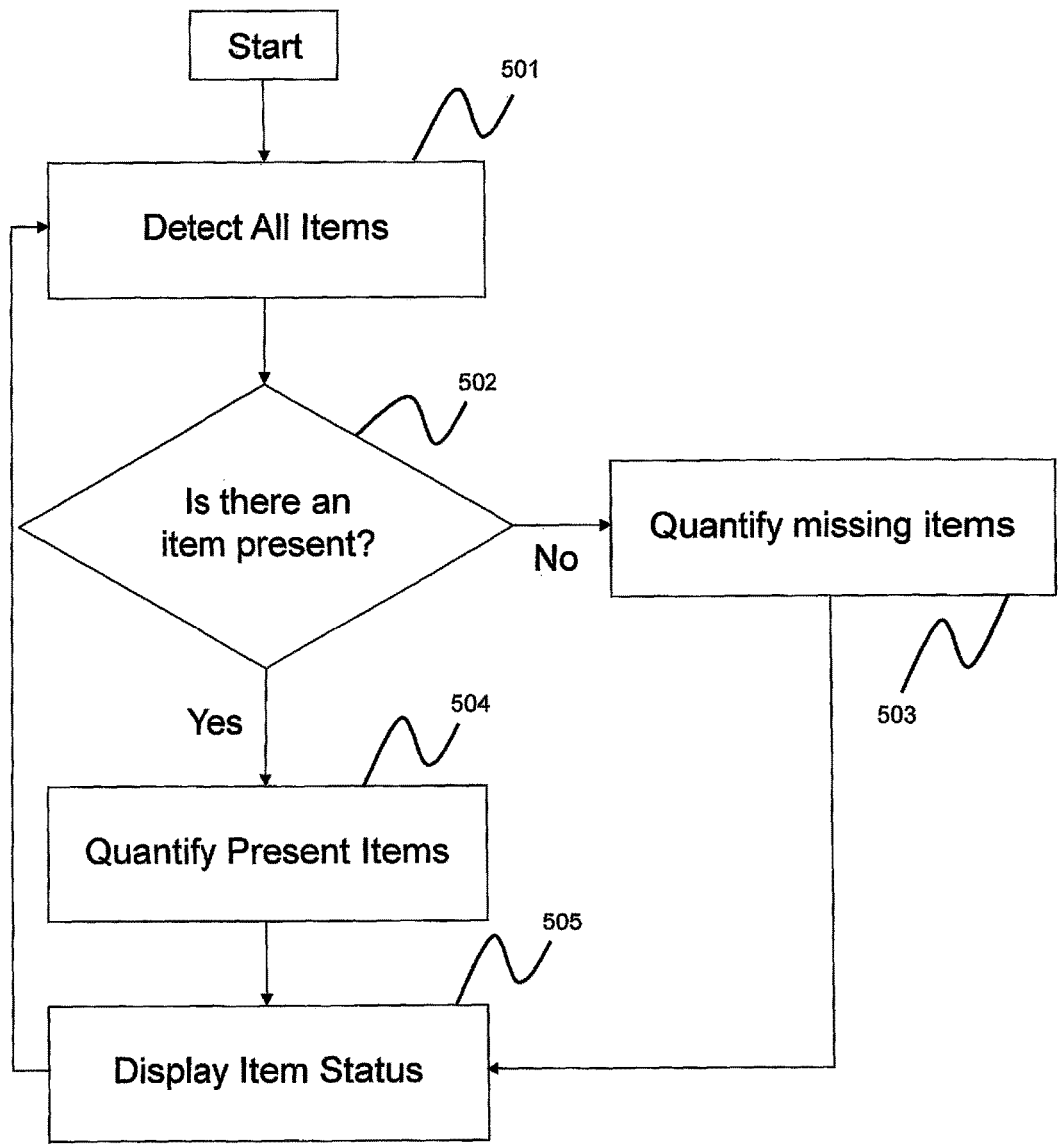
FIG. 5 is a step diagram for one embodiment or aspect of an item storage arrangement, system, and method according to the principles of the present invention.

Referring now to FIG. 5, a method for tracking items in an item storage arrangement system is shown according to a further preferred and non-limiting embodiment or aspect of the present invention. At a first step 501, the entire arrangement is scanned to identify which items are present and which are absent. A first step (501) includes activating each of the signal receiving arrangements described above to scan the system substantially simultaneously. In a second step (502), the present items are detected on a support structure through an interrogation or scanning of a signal emitting member attached to or associated with the item. If an item is missing, there will be no signal, which will indicate that the item has been taken and used. Once the items are detected, at next steps (503) and (504), the missing items can be quantified based on which signal receiving arrangements received no signal, and the present items can be quantified by which signal receiving arrangements received an affirmative (e.g., "present") signal. In the next step (505), the user can determine how many items are present and use the information to decide whether or not to re-order supplies.

In a first embodiment or aspect, a display (such as a monitor or screen attached to, associated with, or in communication with the system) at step (505) will simply output a number indicating, for example, that one of five items are present. In other embodiments or aspects, the display at step (505) could be or include a graphical interface, showing exactly which items are missing, which ones are present, and any sort of alarm, alert, notification, or issues raised from a particular scan. Then, the process proceeds to step (501) to wait for another detection. The return to step (501) can be through either a user-initiated signal, such as opening or closing a cabinet door, pressing a start button, interacting with the display, and/or the like, or it can occur at a predetermined time interval, e.g., making a predetermined number of scans per day based on the predetermined time interval.

Figure 6:
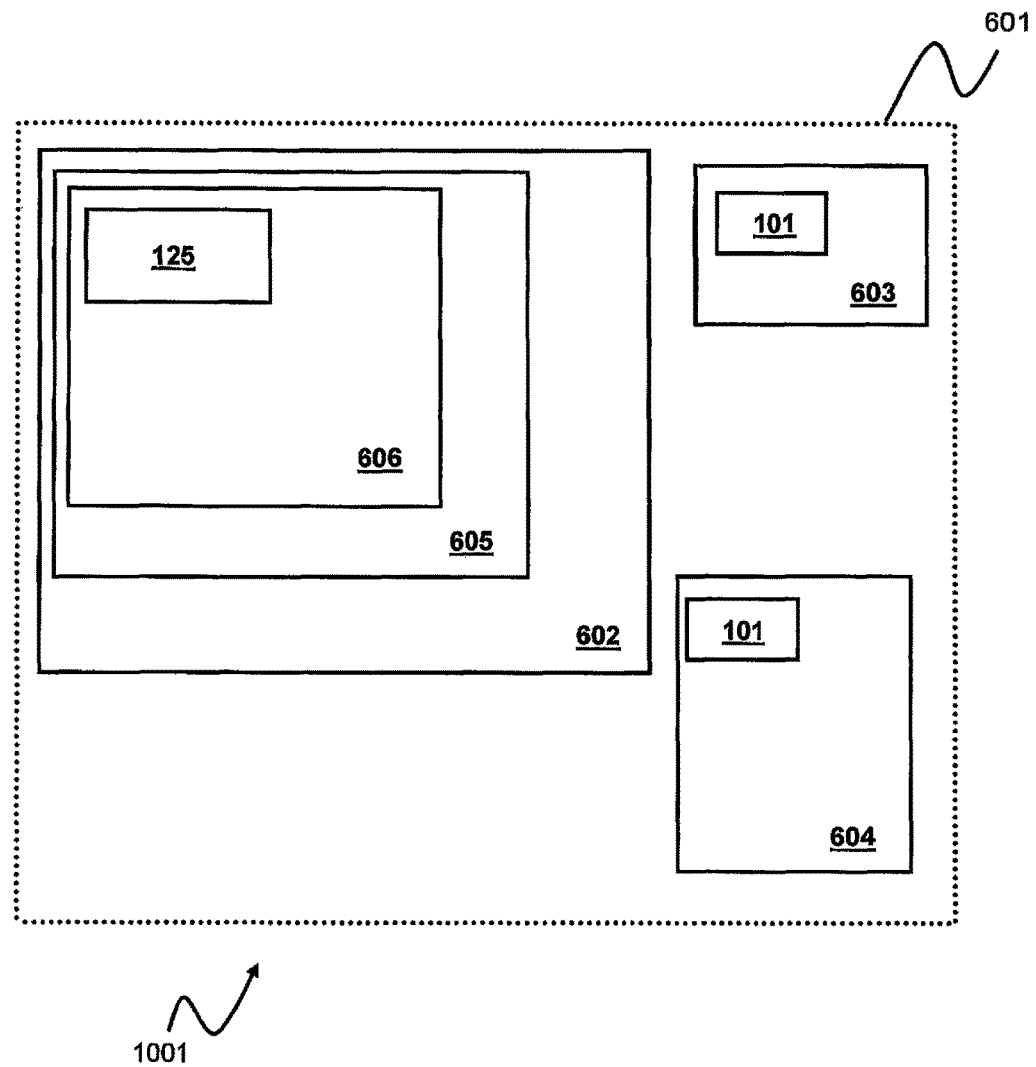
FIG. 6 is a schematic diagram of one embodiment or aspect of an item tracking system according to the principles of the present invention.

Referring now to FIG. 6, an item tracking system 1001 is shown according to a further preferred and non-limiting embodiment or aspect of the present invention. The example depicted in FIG. 6 illustrates how an item (not shown) on an item storage arrangement 125 may be tracked throughout a facility 601, such as, but not limited to, a hospital campus. The facility 601 may include one or more buildings 602-604 in a single area or, in some examples, may include multiple remote locations each including one or more buildings, rooms, departments, and/or the like. In the example shown in FIG. 6, the facility 601 includes a building 602 having a department 605. Multiple departments may exist in one building 602 or across multiple buildings. The department 605 includes a room 606 having an item storage arrangement 125 therein. The department 605 may include one or more rooms, storage areas, and/or the like. The item tracking system 1001 therefore allows for items to be tracked throughout the facility 601.

Still referring to FIG. 6, as an example of the item tracking system 1001, it may be advantageous to track the item usage throughout the facility 601. For example, if a facility 601 has multiple buildings 602-604, several of the buildings having one or more item storage arrangements 125, the total inventory and usage of items could be tracked among the different buildings 602-604. In a more exact tracking method, a facility 601 could track usage of items in individual departments 605 or rooms 606 of a building.

In tracking the item usage throughout a facility 601, the facility management could allocate more inventory to one building 602-604 if its use of the item is higher than the other buildings 602-604. This would ensure the higher-use building is more adequately stocked for its needs and the lower-use buildings can save space by removing excess storage. Additionally, by tracking the inventory across a facility 601, if one building is low on items and in need of more, the building can identify which other buildings have the item, and restock without having to order more. This may be particularly advantageous if the item is needed as quickly as possible. It will be appreciated that various other arrangements are possible.

In one preferred and non-limiting embodiment or aspect, and by using the above-discussed system and method, the scanning or interrogation time is greatly reduced. For example, when using a five-antenna arrangement (e.g., the arrangement shown in FIG. 1), and at about 4 seconds per scan, the substantially simultaneous scanning system and process according to the present invention results in a total scan time of about 4 seconds. This is a much reduced scan time when compared to the 20 second scan time that is evident in the single scanning system and process according to the prior art five-antenna arrangement (e.g., the arrangement shown in FIG. 2).

Further, the use of the above-discussed substantially simultaneous multi-antenna scanning system and process according to the present invention, the magnetic field produced by the antennae is maximized, such as the effect that results from the preferred and non-limiting embodiment or aspect where at least two antennae read the same signal emitting device, e.g., tag or transponder. In particular, the magnetic coupling is increased, with a similar increase in accuracy of the scanning or interrogation process.

Although the invention has been described in detail for the purpose of illustration based on what is currently considered to be the most practical and preferred embodiments or aspects, it is to be understood that such detail is solely for that purpose and that the invention is not limited to the disclosed embodiments or aspects, but, on the contrary, is intended to cover modifications and equivalent arrangements that are within the spirit and scope of the appended claims. For example, it is to be understood that the present invention contemplates that, to the extent possible, one or more features of any embodiment or aspect can be combined with one or more features of any other embodiment or aspect.

What is claimed is:

1. An item storage system, comprising:
   at least one housing having an interior;
   a plurality of item storage arrangements disposed in or associated with the at least one housing;
   a plurality of signal receiving arrangements comprising at least three signal receiving arrangements, configured to receive signals or data from a plurality of signal emitting members, wherein at least one signal receiving arrangement of the plurality of signal receiving arrangements is adjacent more than one item storage arrangement; and
   at least one controller in communication with the plurality of signal receiving arrangements, the at least one controller programmed or configured to:
   simultaneously activate the plurality of signal receiving arrangements, at least two signal receiving arrangements of the plurality of signal receiving arrangements receiving signals or data from a same signal emitting member of the plurality of signal emitting members;
   cause at least one signal receiving arrangement of the plurality of signal receiving arrangements to produce a signal in a bilateral direction to receive signals or data from signal emitting members disposed in or associated with more than one item storage arrangement positioned on opposing sides of each signal receiving arrangement of the at least one signal receiving arrangement; and
   determine on which item storage arrangement of the more than one item storage arrangement positioned on opposing sides of each signal receiving arrangement a detected signal emitting member is positioned based on the received signal or data in response to the produced signal in a bilateral direction.

2. The item storage system of claim 1, wherein each item storage arrangement is positioned adjacent at least two signal receiving arrangements of the plurality of signal receiving arrangements.

3. The item storage system of claim 1, wherein the plurality of signal receiving arrangements are spaced in the interior of the at least one housing, and wherein each item storage arrangement is located between at least two signal receiving arrangements.

4. The item storage system of claim 1, wherein at least one of the item storage arrangements comprises at least one of the following: a hanger, a compartment, a slot, a container, a shelf, a hook, or any combination thereof.

5. The item storage system of claim 1, wherein the at least one housing comprises a cabinet with at least one door.

6. The item storage system of claim 5, wherein the at least one controller is further programmed or configured to activate the plurality of signal receiving arrangements, such that the signals or data of the plurality of signal emitting devices are received after the at least one door is closed from an open position.

7. The item storage system of claim 6, further comprising at least one locking mechanism configured to lock and unlock the at least one door of the cabinet, wherein the at least one locking mechanism locks the at least one door of the cabinet while the plurality of signal emitting members are interrogated or scanned.

8. The item storage system of claim 1, wherein the item storage system is configured to store at least one of the following: medical items, catheters, containers, medicine, instruments, equipment, components, or any combination thereof.

9. The item storage system of claim 1, wherein the at least one signal receiving arrangement receives signals or data simultaneously from signal emitting members disposed in or associated with more than one item storage arrangement.

10. The item storage system of claim 1, wherein each of the plurality of item storage arrangements is oriented vertically and positioned between two signal receiving arrangements.

11. An item storage cabinet for tracking items having signal emitting members attached thereto or associated therewith, the cabinet comprising:
   a plurality of item storage arrangements positioned in or associated with the interior cavity, each item storage arrangement configured to support at least one item having at least one signal emitting member attached thereto or associated therewith;
   a plurality of signal receiving arrangements comprising at least three signal receiving arrangements, wherein at least one signal receiving arrangement of the plurality of signal receiving arrangements is located between more than one item storage arrangement; and
   at least one controller programmed or configured to:
   simultaneously activate the plurality of signal receiving arrangements to interrogate or scan each signal emitting member of the plurality of signal emitting members, such that at least two signal receiving arrangements of the plurality of signal receiving arrangements receive signals or data from a same signal emitting member of the plurality of signal emitting members; and cause at least one signal receiving arrangement of the plurality of signal receiving arrangements to produce a signal in a bilateral direction to interrogate or scan signal emitting members disposed in or associated with more than one item storage arrangement positioned on opposing sides of each signal receiving arrangement of the at least one signal receiving arrangement; and determine on which item storage arrangement of the more than one item storage arrangement positioned on opposing sides of each signal receiving arrangement a detected signal emitting member is positioned based on the received signal or data in response to the produced signal in a bilateral direction.

12. The item storage cabinet of claim 11, wherein the plurality of signal receiving arrangements are spaced in the interior cavity, and wherein each item storage arrangement is located between two signal receiving arrangements.

13. The item storage cabinet of claim 12, wherein the plurality of signal receiving arrangements are spaced evenly in the interior cavity.

14. The item storage cabinet of claim 11, wherein at least one of the item storage arrangements comprises at least one of the following: a hanger, a compartment, a slot, a container, a shelf, a hook, or any combination thereof.

15. The item storage cabinet of claim 11, further comprising at least one drawer or at least one door for providing access to at least a portion of the interior cavity of the cabinet.

16. The item storage cabinet of claim 15, wherein the at least one controller is further programmed or configured to activate the plurality of signal receiving arrangements after the at least one drawer or the at least one door is closed from an open position.

17. The item storage cabinet of claim 15, further comprising at least one locking mechanism configured to lock and unlock the at least one drawer or the at least one door, wherein the at least one locking mechanism locks the cabinet while the plurality of signal emitting members are interrogated or scanned.

18. The item storage cabinet of claim 11, wherein the at least one controller is programmed or configured to:
cause the at least one signal receiving arrangement to simultaneously interrogate or scan members disposed in or associated with more than one signal emitting item storage arrangement.

19. The item storage cabinet of claim 11, wherein each of the plurality of item storage arrangements is oriented vertically and positioned between two signal receiving arrangements.

20. A method for tracking items in an item storage arrangement system, comprising:
simultaneously activating a plurality of signal receiving arrangements comprising at least three signal receiving arrangements;

using at least one signal receiving arrangement of the plurality of signal receiving arrangements, producing a signal in a bilateral direction for simultaneously interrogating or scanning each signal emitting member attached to or associated with at least one item supported by more than one item storage arrangement of a plurality of item storage arrangements, the more than one item storage arrangement positioned on opposing sides of each signal receiving arrangement of the at least one signal receiving arrangement;

using at least two signal receiving arrangements of the plurality of signal receiving arrangements, simultaneously interrogating or scanning a same signal emitting member attached or associated with at least one item supported by at least one item storage arrangement of the plurality of item storage arrangements;

receiving identification signals or data from at least one item emitting member attached to or associated with at least one item supported by an item storage arrangement of the plurality of item storage arrangements;

determining, based at least partially on the identification data or signals, a presence or absence of the at least one item;

determining on which item storage arrangement of the more than one item storage arrangement positioned on opposing sides of each signal receiving arrangement a detected signal emitting member is positioned based on the received signal or data in response to the produced signal in a bilateral direction; and controlling at least one indication device based at least partially on the presence or absence of the at least one item.

21. The method for tracking items in a storage arrangement system of claim 20, wherein at least one of the plurality of item storage arrangements is oriented in a vertical arrangement.

22. The method for tracking items in a storage arrangement system of claim 20, wherein at least one of the plurality of item storage arrangements is oriented in a horizontal arrangement.

23. The method for tracking items in a storage arrangement system of claim 20, wherein the plurality of item storage arrangements is at least partially contained in or associated with an interior of at least one housing.

24. The method for tracking items in an item storage arrangement system of claim 20, wherein at least one of the item storage arrangements comprises at least one of the following: a hanger, a compartment, a slot, a container, a shelf, a hook, or any combination thereof.

25. The method for tracking items in a storage arrangement system of claim 21, wherein each of the plurality of item storage arrangements is positioned between two signal receiving arrangements.

* * * * *

UNITED STATES PATENT AND TRADEMARK OFFICE
CERTIFICATE OF CORRECTION

PATENT NO. : 10,034,400 B2
APPLICATION NO. : 14/558064
DATED : July 24, 2018
INVENTOR(S) : Muhammad R. Rahim et al.

It is certified that error appears in the above-identified patent and that said Letters Patent is hereby corrected as shown below:

In the Claims

Column 14, Line 48, Claim 11, after "comprising:" insert -- an interior cavity or area; --

Signed and Sealed this
Thirtieth Day of October, 2018

Andrei Iancu
*Director of the United States Patent and Trademark Office*